(12) United States Patent
Fritzinger et al.

(10) Patent No.: US 6,358,790 B1
(45) Date of Patent: *Mar. 19, 2002

(54) METHOD OF MAKING A CAPACITOR

(75) Inventors: Larry Bruce Fritzinger; Nace Layadi; Sailesh Mansinh Merchant; Pradip Kumar Roy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/250,501

(22) Filed: Feb. 16, 1999

Related U.S. Application Data
(60) Provisional application No. 60/115,762, filed on Jan. 13, 1999.

(51) Int. Cl.$^7$ .......................................... H01L 21/8234
(52) U.S. Cl. ...................................... 438/243; 438/386
(58) Field of Search ................................ 438/239, 240, 438/242, 243, 244, 250, 253, 386, 387, 396, 259, 589, 381, 3, 398

(56) References Cited

U.S. PATENT DOCUMENTS

| | | |
|---|---|---|
| 5,049,956 A | 9/1991 | Yoshida et al. |
| 5,192,703 A | 3/1993 | Lee et al. |
| 5,436,477 A | 7/1995 | Hashizume et al. |
| 5,442,213 A | 8/1995 | Okudaira et al. |
| 5,585,673 A | 12/1996 | Joshi et al. |
| 5,693,561 A | 12/1997 | Merchant et al. |
| 5,726,497 A | 3/1998 | Chao et al. |
| 5,811,851 A | 9/1998 | Nishioka et al. |
| 5,973,351 A | 10/1999 | Kotecki et al. |
| 5,976,928 A * | 11/1999 | Kirlin et al. ................. 438/240 |
| 5,998,261 A | 12/1999 | Hofmann et al. |
| 6,001,660 A | 12/1999 | Park et al. |
| 6,057,081 A | 5/2000 | Yunogami et al. |
| 6,057,571 A | 5/2000 | Miller et al. |
| 6,103,586 A * | 8/2000 | Chetlur et al. ............... 438/396 |
| 6,107,105 A * | 8/2000 | Sandhu .......................... 438/3 |
| 6,153,901 A * | 11/2000 | Higashi ...................... 257/301 |
| 6,218,255 B1 * | 4/2001 | Fritzinger et al. .......... 438/386 |
| 6,277,707 B1 * | 8/2001 | Lee et al. .................... 438/430 |

FOREIGN PATENT DOCUMENTS

| JP | 3-292765 | 12/1991 |
|---|---|---|

\* cited by examiner

*Primary Examiner*—David Nelms
*Assistant Examiner*—David Nhu

(57) ABSTRACT

The present invention provides a method for fabricating a capacitor, comprising the steps of forming a trench in a substrate, forming a layer of a first material selected from the group consisting of titanium and titanium nitride in the trench, filling the trench with a conductive material to form a plug, planarizing the substrate, patterning the substrate to expose the first material, forming an electrode material layer over the substrate, and patterning the electrode material layer, whereby the first material is substantially encapsulated by the electrode material layer.

14 Claims, 3 Drawing Sheets

METHOD OF MAKING A CAPACITOR

This application claims priority from provisional application Ser. No. 60/115,762, filed on Jan. 13, 1999.

FIELD OF THE INVENTION

The present invention is directed, in general, to integrated circuits and, more specifically, to an integrated circuit that includes a reduced feature size capacitor which overcomes the leakage current problems and other problems of the prior art.

BACKGROUND OF THE INVENTION

Integrated circuits in general, and CMOS devices in particular, have continued to gain wide spread usage as user demands for increased functionality and enhanced benefits continue to increase. In order to meet this demand, the integrated circuit industry continues to decrease the feature size of circuit structures in order to place more circuits in the same size integrated circuit area thereby continuously increasing the packing density for a given chip size. Over the last several years, structures have evolved from 1.2 micron gate areas (1 Mbit capacity) in the past, down to gate structure areas of 0.25 microns (1 Gbit capacity) and are expected to become even smaller in the near future.

For example, the ever-increasing demand for computer memory to facilitate calculations and data storage has fostered intense development efforts in the area of Dynamic Random Access Memory (DRAM), and especially embedded DRAM. The DRAM is generally a collection of transistor devices with each having an integrated circuit capacitor typically connected to its source electrode thereby forming a memory cell. This collection of memory cells is then arranged into a memory structure using a word line and a bit line to address each memory cell. This integrated capacitor may store an electrical charge to represent a binary "1" or store no electrical charge for a binary "0" as instructed by the word and bit control lines.

Construction of these memory capacitors consists of using typically a tungsten (W) plug electrode structure for 0.25 micron technology connected to the source of the transistor, which then supports a dielectric material, such as tantalum pentoxide ($Ta_2O_5$), and then a top electrode, in sequence. There are many other uses for these capacitors in integrated circuits.

As the size technology of CMOS devices continues to shrink, the structure for a given memory size or circuit capability also shrinks as noted above. For example, the bond pads, which allow the integrated circuit to connect to external circuitry, cannot continue to shrink indefinitely. Currently, an integrated circuit package may have about 200 bond pads that are 50 microns by 50 microns in size. Shrinking topology coupled with this bond pad lower size limitation results in an excess of empty space around the bond pads. This allows for the inclusion of additional embedded memory around the bond pads. The use of higher dielectric constant oxides such as tantalum pentoxide as substitutes for silicon dioxide have allowed smaller structures still.

In an attempt to add the above-mentioned memory in certain conventional CMOS technologies, some manufacturers have partially etched back the material surrounding the plug to allow access to a portion of the area of the sidewalls in order to use the sidewalls of the plug to add to the capacitance per unit area. The capacitor dielectric then covers both the top of the plug, which is usually bare tungsten, and the sidewalls of the plug, which are usually titanium nitride (TiN). However, it has been observed that when this is done in conjunction with tantalum pentoxide being used as the dielectric, undesirable leakage current increases not in proportion to the area of the plug (a factor of two or three), but by two or three orders of magnitude. Accordingly, what is needed is a reduced feature size capacitor which overcomes the leakage current problems and other problems of the prior art.

SUMMARY OF THE INVENTION

The present invention provides for use with an integrated circuit, a method for fabricating a capacitor, comprising, forming a layer of a first material in a trench located in a substrate selected from the group consisting of titanium and titanium nitride in the trench, filling the trench with a conductive material, patterning the substrate to expose a portion of the first material located in the trench, forming an electrode material layer over the substrate and the first material to substantially encapsulate the first material with the electrode material layer and forming a capacitor dielectric layer comprising tantalum pentoxide over the electrode material layer.

BRIEF DESCRIPTION OF THE DRAWINGS

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity.

DETAILED DESCRIPTION

Figure 1:
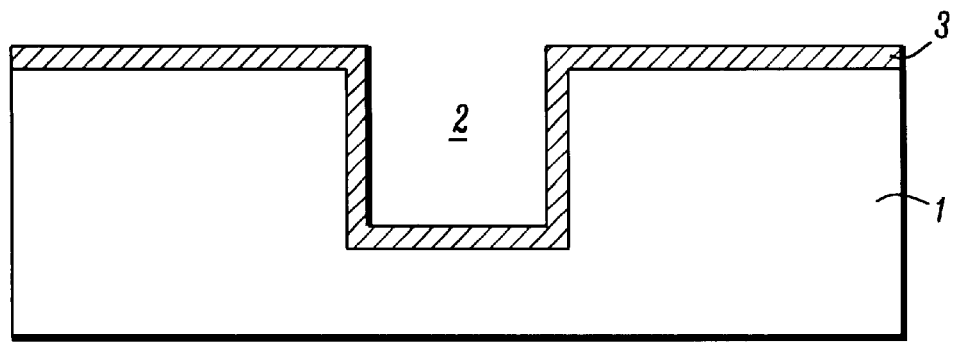
FIGS. 1–9 show a cross-sectional view of an integrated circuit during various steps in accordance with an embodiment of the invention.
Figure 2:
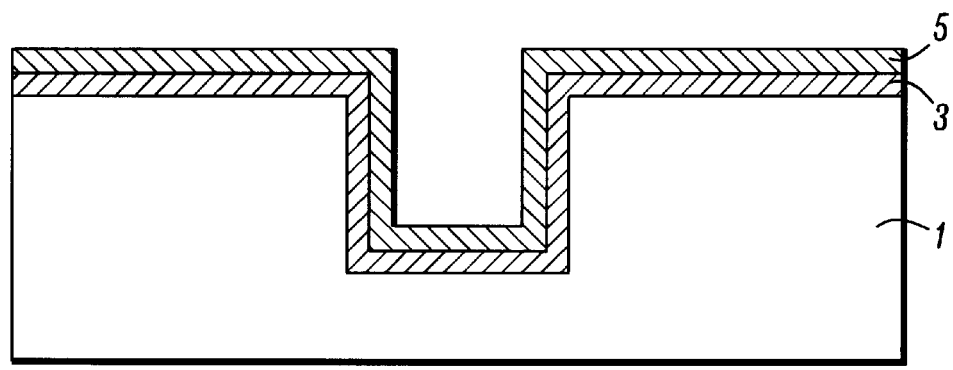
Figure 3:
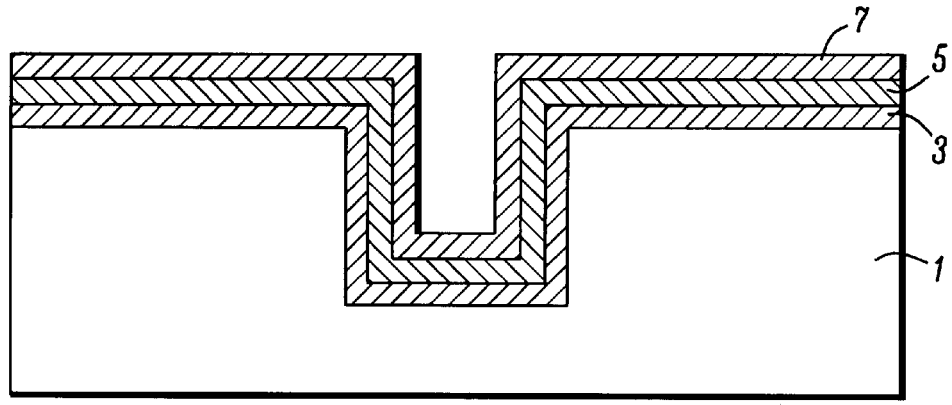
Figure 4:
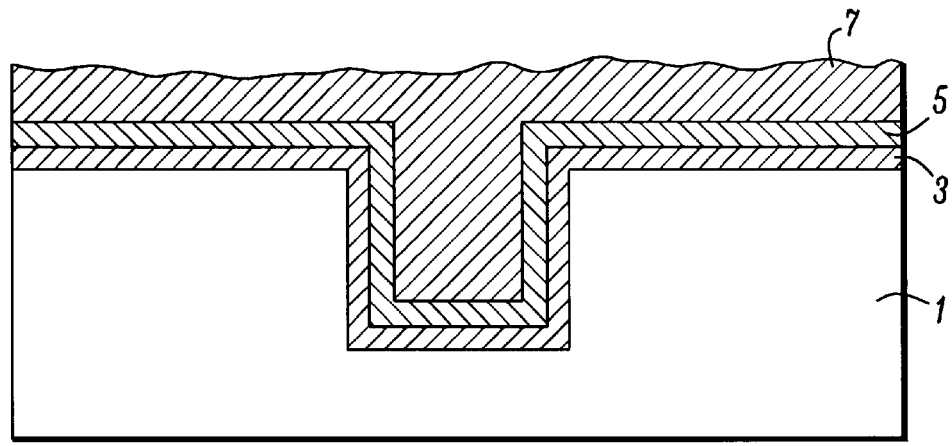
Figure 5:
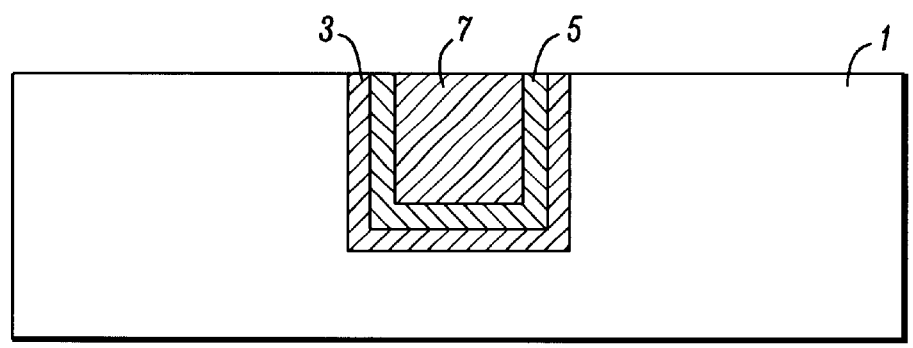
Figure 6:
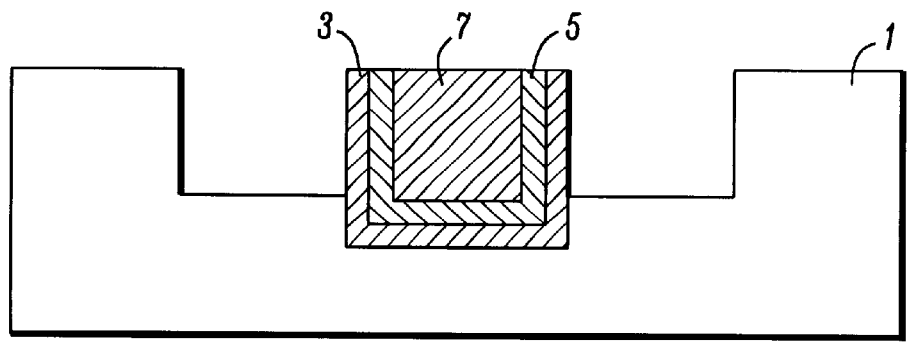
Figure 7:
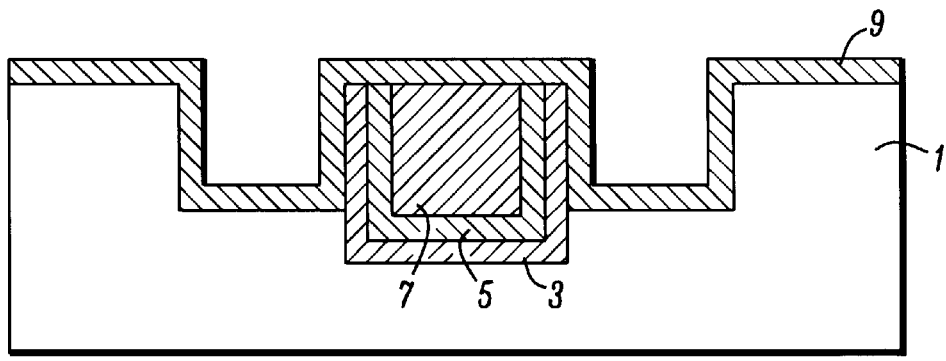
Figure 8:
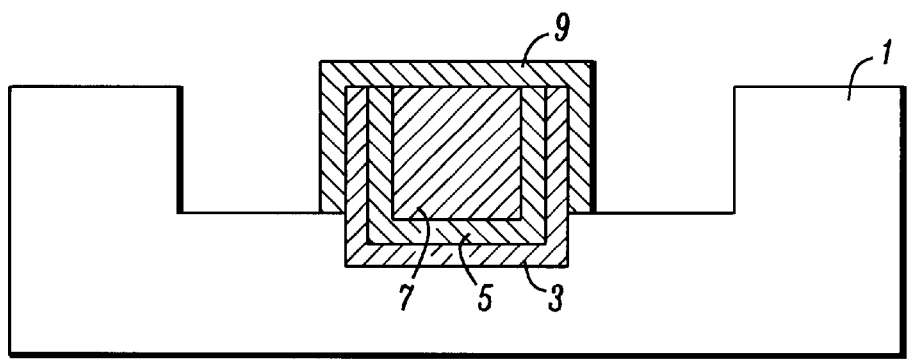
Figure 9:
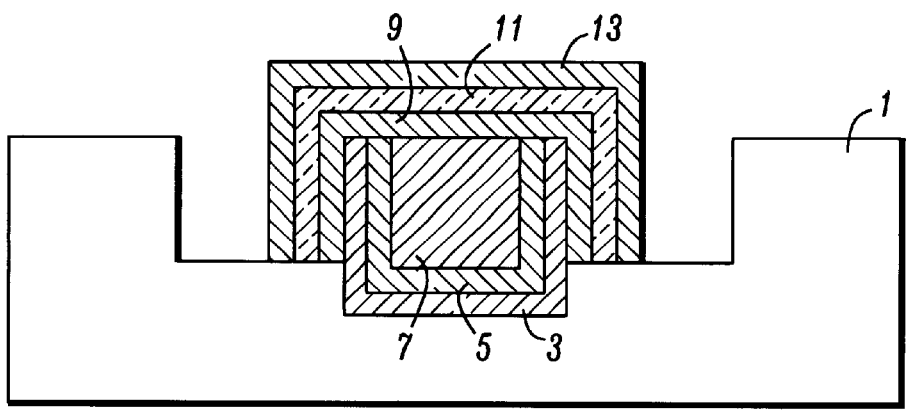

Referring initially to FIG. 1, illustrated is a substrate 1 having a trench 2 formed therein. FIG. 2 shows a titanium layer 3, optional but preferred, formed in the trench and over the substrate, while FIG. 3 shows a titanium nitride layer 5 being formed over the titanium layer 3. FIG. 4 shows the forming of an electrical conductor 7 like tungsten in the trench 2. The surface of the substrate 1 is shown after planarizing in FIG. 5. Note that the conductor 7 is now in the form of a plug having titanium nitride sidewalls 5. FIG. 6 shows that after patterning of the substrate, usually by photolithographic means (photoresist, mask and etch), the titanium nitride 5 sidewalls of the conductive 7 plug are now exposed. If a conventional MOM capacitor were to be made, processing would continue at this point with the deposition of a dielectric like tantalum pentoxide and a second electrode. Instead, FIG. 7 shows that an electrode material layer 9 that is not titanium nitride, but rather is tungsten or a tungsten-like material such as tungsten nitride, tungsten silicide or tungsten silicide nitride is deposited over the conductor 7, the titanium 3 and the titanium nitride 5. FIG. 8 shows that after patterning, the electrode material layer 9 is encapsulating the titanium layer 3 and especially the titanium nitride 5 layer of the plug. In this way titanium nitride 5 is prevented from contacting any subsequently applied tantalum pentoxide to reduce leakage current. FIG. 9 shows a built up MOM capacitor with electrode material layer 9, tantalum pentoxide dielectric 11 and a second electrode 13. Note that the titanium nitride layer 5 does not contact the tantalum pentoxide layer 11, but the structure has the desirable surface area increase, resulting from the patterning of the substrate, that allows an increase in capacitance per unit area.

It is not completely understood why tantalum pentoxide in contact with titanium nitride, as opposed to bare tungsten, has such a high leakage current. It is believed that titanium nitride reacts with tantalum pentoxide to form titanium suboxides, which are resistive. Alternatively, or in addition, the use of titanium nitride in conjunction with tantalum pentoxide and an underlying Ti layer getters the oxygen from the tantalum pentoxide via diffusion through the barrier, thus reducing the tantalum pentoxide to elemental Ta, creating electrical leakage paths or shorts. This results in general circuit performance degradation or failure.

The substrate will generally be a semiconductor such as silicon, preferably a dielectric such as silicon dioxide or both. In a typical embedded DRAM application the conductive plug 7 will be surrounded by dielectric and the bottom of the conductive plug 7 will contact the top of a transistor structure (not shown) in silicon.

Formation of the trench 2 is by conventional patterning such as by photoresist, masking and etching. A "trench" is generally a feature that does not extend all the way through a substrate, but a "trench" is not necessarily elongated and a trench may be round. However as used herein "trench", for simplicity, also encompasses a "via", which provides electrical communication between two layers, but a via need not be round. In the context of this invention, a trench can extend partially or fully through the substrate to form a via.

Formation of the titanium layer 3 and the titanium nitride layer 5 may be done by conventional physical vapor deposition (PVD) or chemical vapor deposition (CVD).

The conductive material 7 used to form the plug is preferably tungsten, but alternative materials include aluminum, aluminum alloys such as aluminum copper and aluminum silicon copper, doped polysilicon and the like and these may be deposited by conventional PVD, CVD, electroless and electrolytic plating and the like. Note that when the conductive plug 7 is W, the layer 5 on the W will be TiN and over the TiN will be an optional but preferred Ti layer 3. However, when the conductive plug is aluminum, the adhesion and barrier layers will usually be Ti/TiN/Ti or Ti.

The electrode material layer 9 is an electrical conductor that is not titanium or titanium nitride. Preferred materials include tungsten, tungsten nitride, tungsten silicide, tungsten silicide nitride and combinations thereof. Tungsten may be put down as thin as about 50 to about 100 nm by conventional PVD or CVD. Tungsten nitride, tungsten silicide and tungsten silicide nitride may be put down as thin as about 10 to about 20 nm. They are preferred to tungsten, as they may be put down thinner. Embodiments of capacitor bottom electrode stack-ups of the present invention include W (or aluminum, aluminum alloys, doped polysilicon) plug 7/ TiN as layer 3 and optional Ti as layer 5 or Ti/TiN/Ti or Ti when the plug 7 is Al/W or WN or WSiN or WSi or combinations as layer 9. Final capacitors would further comprise $Ta_2O_5$ as dielectric layer 11 or other titanium nitride reactive or reducible dielectric and Al, W, doped polysilicon or other electrical conductor as a top electrode 13.

In an advantageous embodiment, the electrode material layer 9 may be deposited to a thickness of about 10 nm to about 100 nm at a temperature ranging from about 150° C. to about 400° C., under a pressure ranging from about 2 milliTorr to about 6 milliTorr. The deposition of the electrode material layer 9 may be accomplished by physical vapor deposition at a power ranging from about 1 to about 12 kilowatts. If tungsten nitride or tungsten nitride silicide is used to form layer 9, this can be done by reactive sputtering of tungsten or tungsten silicide in nitrogen. The tungsten silicide and tungsten nitride may be deposited as a functionally gradient material, wherein the nitrogen and silicon content are made to deliberately vary smoothly within the film thickness. The dielectric layer 11 is then formed using tantalum pentoxide by conventional deposition processes. Finally, aluminum, W, doped polysilicon or other conductor forms layer 13, which is used to make electrical connection to the rest of the embedded DRAM circuit and as a second electrode.

Note that the deposition of tungsten nitride and tungsten silicide nitride may also be accomplished by chemical vapor deposition (CVD). Tungsten nitride is typically applied using $WF_6$ and ammonia ($NH_3$) as precursors, while $Si_2H_6$ is added to the mix to make tungsten silicide nitride. However, the present invention is preferably done in the absence of ammonia, which generates hydrogen. While not wishing to be held to any theory, it is believed that the hydrogen reduces the tantalum pentoxide. Nitrogen trifluoride should be used instead of ammonia as a nitrogen source when using CVD.

The dielectric layer 11 may be made of a titanium or titanium nitride reactive dielectrics including tantalum pentoxide or aluminum doped tantalum pentoxide. Particularly preferred is the use of a stacked tantalum pentoxide dielectric system wherein silicon dioxide is first formed on silicon, followed by tantalum pentoxide, followed by another layer of silicon dioxide. Respective thicknesses are about 10 to about 2 nm, about 5 to about 30 nm and about 10 to about 120 nm. Stacked tantalum pentoxide systems are described by P. K. Roy et al. in Appl. Phys. Letts., Vol. 72, No. 22, Jun. 1, 1998, pp. 2835–37, incorporated herein by reference as if set forth in full.

One application for such a capacitor electrode is in memory, optionally embedded, having a transistor in contact with an interconnect plug 7 formed within a dielectric layer overlaying the transistor. In one embodiment, the memory comprises a capacitor located on the dielectric layer that contacts the interconnect. In this particular embodiment, the capacitor includes a capacitor electrode located on the interconnect, wherein the electrode comprises a conductive plug having titanium nitride on its sidewalls that has been encapsulated with an electrode material that is not titanium nitride. Tungsten may be used, but tungsten nitride (WN), tungsten silicide (WSi) and tungsten silicide nitride (WSiN) are preferred. Moreover, the thickness of the electrode material may, of course, vary depending on the design. However, in one particular embodiment, the electrode material may have a thickness ranging from about 10 nm to about 100 nm.

In the present invention, the capacitor in use will further include a capacitor dielectric located on the electrode material. For example, in one embodiment, the capacitor dielectric may be tantalum pentoxide. To form a metal-oxide-metal (MOM) capacitor requires a second electrode located over the capacitor dielectric.

In another embodiment, a capacitor includes a conductive plug having titanium nitride thereon, including over the top of the plug, an electrode material layer and a capacitor dielectric. The electrode material layer serves as an electrode and to prevent contact of the dielectric material with titanium nitride. In such embodiments, the electrode material layer may be comprised of tungsten, tungsten nitride, tungsten silicide and tungsten silicide nitride.

It is readily apparent that the present invention provides for use with an integrated circuit, an embedded memory having a transistor (not shown) in contact with an interconnect conductive plug formed within a dielectric layer overlaying the transistor. The embedded memory comprises a capacitor of the present invention: an interconnect plug coated with a material to cover the titanium or titanium nitride, a dielectric and a top electrode located on the dielectric layer, the interconnect plug also providing connection with a transistor.

The foregoing has disclosed preferred and alternative features and embodiments of the present invention so that one of ordinary skill in the art may better understand the detailed description of the invention that follows. Additional features of the invention will be described hereinafter that form the subject of the claims of the invention. One of ordinary skill in the art having the benefit of the present disclosure can appreciate that he can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. A method for fabricating a capacitor, comprising:
    forming a layer of a first material selected from the group consisting of titanium and titanium nitride in a trench located in a substrate;
    filing the trench with a conductive material;
    patterning the substrate to expose a portion of the first material in the trench;
    forming an electrode material layer over the substrate and the first material to substantially encapsulate the first material with the electrode material layer; and
    forming a capacitor dielectric layer comprising tantalum pentoxide over the electrode material layer.

2. The method as recited in claim 1, wherein the substrate is selected from the group consisting of silicon and silicon dioxide.

3. The method as recited in claim 1, wherein the conductive material is selected from the group consisting of tungsten, aluminum alloys and doped polysilicon.

4. The method as recited in claim 1, wherein the electrode material is selected from the group consisting of tungsten, tungsten nitride, tungsten silicide, tungsten silicide nitride and mixtures thereof.

5. The method as recited in claim 1, further comprising wherein forming a capacitor dielectric over the electrode material, wherein the capacitor dielectric is reactive with titanium nitride or titanium.

6. The method as recited in claim 1, wherein the thickness of the electrode material layer ranges from about 10 nm to about 100 nm.

7. A capacitor produced by the method of claim 1.

8. A capacitor fabricated by the method of claim 1, comprising a layer of capacitor dielectric that is reactive with titanium nitride or titanium, and a second electrode.

9. A circuit comprising the capacitor produced by the method of claim 1.

10. An embedded dynamic random access memory circuit comprising the capacitor produced by the method of claim 1.

11. A method for fabricating a capacitor, comprising:
    forming a trench in a substrate, wherein the substrate is selected from the group consisting of silicon and silicon dioxide;
    forming titanium nitride over the titanium;
    filling the trench with a conductive material to form a plug, wherein the conductive material is tungsten;
    planarizing the substrate;
    patterning the substrate to expose the titanium nitride of the plug;
    forming an electrode material layer over the substrate, wherein the electrode material is selected from the group consisting of tungsten, tungsten nitride, tungsten silicide, tungsten silicide nitride and mixtures thereof; and
    forming a capacitor dielectric layer comprising tantalum pentoxide over the electrode material layer.

12. A capacitor produced by the method of claim 11.

13. A method for fabricating a capacitor, comprising:
    forming a trench in a substrate, wherein the substrate is selected from the group consisting of silicon and silicon dioxide;
    forming a layer of titanium nitride in the trench;
    filling the trench with a conductive material to form a plug, wherein the conductive material is selected from the group consisting of tungsten, aluminum and doped polysilicon;
    planarizing the substrate;
    patterning the substrate to expose the titanium nitride of the plug;
    forming an electrode material layer over the substrate, wherein the electrode material is selected from the group consisting of tungsten, tungsten nitride, tungsten silicide, tungsten silicide nitride and mixtures thereof; and
    forming a capacitor dielectric layer comprising tantalum pentoxide over the electrode material layer.

14. A capacitor produced by the method of claim 13.

* * * * *